United States Patent [19]
Kosuga et al.

[11] Patent Number: 5,576,920
[45] Date of Patent: Nov. 19, 1996

[54] ELECTROSTATIC DESTRUCTION PREVENTING CIRCUIT AND RECEIVING APPARATUS HAVING THE SAME

[75] Inventors: Tadashi Kosuga; Kazuhiko Takahashi; Yoshimi Tsuboi, all of Kawagoe, Japan

[73] Assignee: Pioneer Electronic Corporation, Tokyo-to, Japan

[21] Appl. No.: 433,525

[22] Filed: May 2, 1995

[30] Foreign Application Priority Data

May 2, 1994 [JP] Japan ............................... 6-093295

[51] Int. Cl.$^6$ ............................................. H02H 9/00
[52] U.S. Cl. ......................... 361/56; 361/91; 361/111; 361/119
[58] Field of Search ........................... 361/56, 58, 91, 361/111, 113, 118, 127, 119

[56] References Cited

U.S. PATENT DOCUMENTS 3,587,017   6/1971   Kurusu ................................. 325/362

Primary Examiner—Jeffrey A. Gaffin
Assistant Examiner—Stephen W. Jackson
Attorney, Agent, or Firm—Young & Thompson

[57] ABSTRACT

An electrostatic destruction preventing circuit for a receiving apparatus, is provided with: a first Zener diode coupled to a receiving terminal of the receiving apparatus; a second Zener diode coupled to a ground terminal of the receiving apparatus, and connected to the first Zener diode in series and in reverse polarities to each other; a first resistor connected in parallel to the first Zener diode; and a second resistor connected in parallel to the second Zener diode.

6 Claims, 5 Drawing Sheets

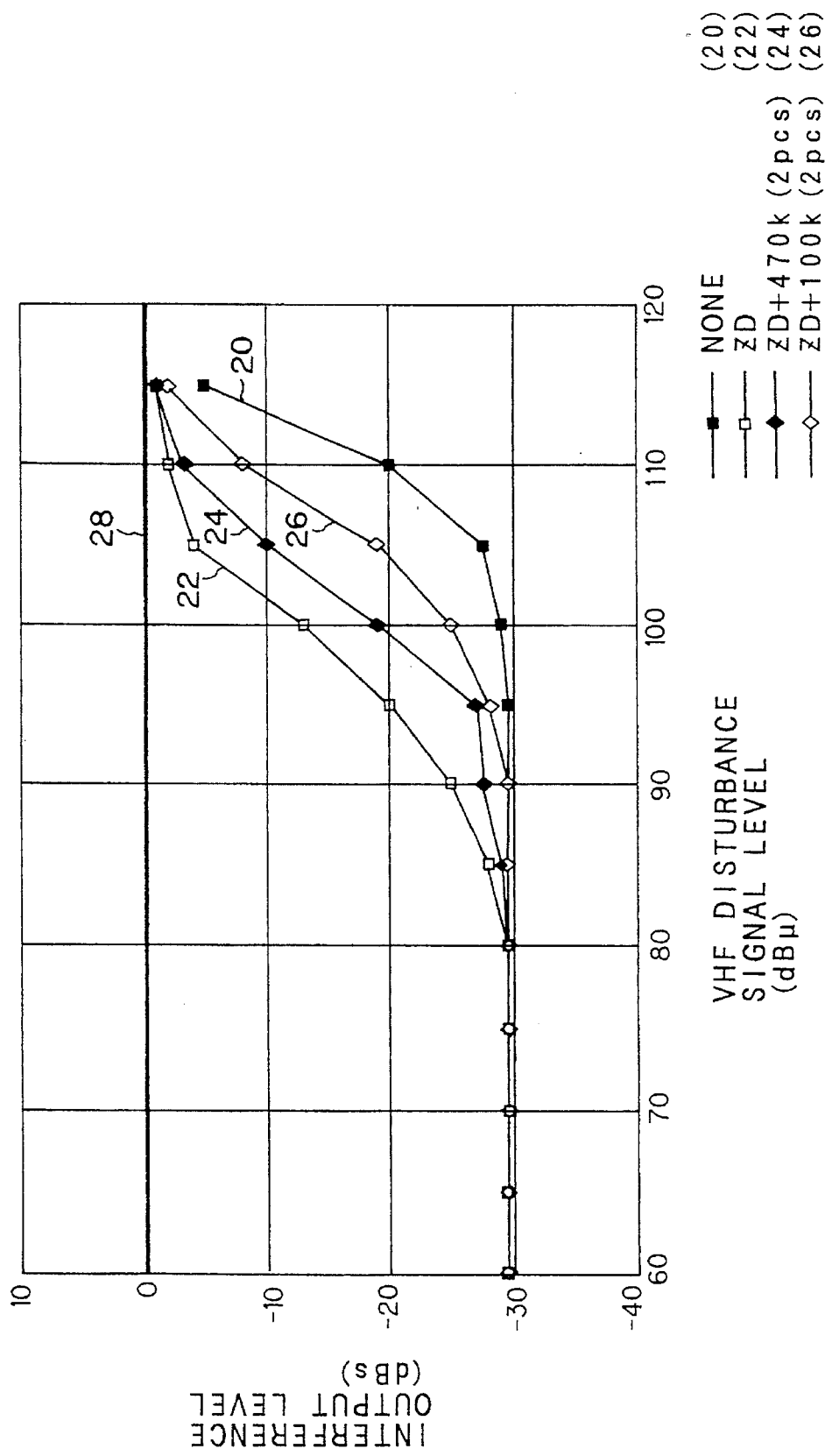

ELECTROSTATIC DESTRUCTION PREVENTING CIRCUIT AND RECEIVING APPARATUS HAVING THE SAME

BACKGROUND OF THE INVENTION

1. Field of the Invention

The present invention relates to an electrostatic destruction preventing circuit for protecting a preamplifier at an input stage of a receiving apparatus from surge voltage of high potential inputted to the receiving apparatus due to a cloud to ground discharge or a static electricity, and more particularly to an electrostatic destruction preventing circuit for reducing the influence of a noise caused by a VHF (Very High Frequency) signal in a receiving apparatus for a medium wave band.

2. Description of the Related Art

In a receiving apparatus which receives an electric wave by an antenna, there is a case that a surge voltage of high potential is inputted thereto by an external noise such as a cloud to ground discharge and a static electricity. In order to prevent this surge voltage of high potential from destroying the amplifier at the input stage, an electrostatic destruction preventing circuit is equipped in the receiving apparatus.

There is one type of electrostatic destruction preventing circuit, which has a discharging element (i.e. surge protector) connected between an input terminal and a ground of the receiving apparatus. Thus, an electric current is escaped to the ground via the discharging element when a surge voltage of high potential is applied to the input terminal from the antenna of the receiving apparatus. In this manner, the first stage amplifier, which is connected to the input terminal, is protected by the discharging element from an excess voltage inputted from the antenna. In this electrostatic destruction preventing circuit, the response to the electrostatic destruction is certain, and there is little drawback caused by providing the electrostatic destruction preventing circuit.

However, the electrostatic destruction preventing circuit of this type has such a defect that the cost is too high.

There is another type of electrostatic destruction preventing circuit, which has Zener diodes connected between the input terminal and the ground of the receiving apparatus, as disclosed in Japanese Utility Model Application Laid Open Hei. 5-68,141. The Zener diodes are connected in reverse polarities to each other. Thus, an electric current is escaped to the ground via the Zener diodes when a surge voltage of high potential is applied to the input terminal from the antenna of the receiving apparatus. In this manner, the first stage amplifier, which is connected to the input terminal, is protected by the Zener diodes from an excess voltage inputted from the antenna. This electrostatic destruction preventing circuit has such a characteristic that it is rather simply constructed, it is cheap and it is good in a response property at the time of surge absorption. Further, the distortion is not generated in the receiving signal even under the strong electric field.

However, the electrostatic destruction of this type has such a defect that a disturbance from Other frequency band is easily generated in case that this circuit is used for a MW (Medium Wave) receiving apparatus which receives the medium wave band. Consequently, the S/N ratio obtained by the receiving apparatus is degraded.

SUMMARY OF THE INVENTION

It is therefore an object of the present invention to provide an electrostatic destruction preventing circuit and a receiving apparatus having the electrostatic destruction preventing circuit, which can prevent the disturbance by the other received electric wave by means of a rather simple and economical construction.

The above object of the present invention can be achieved by an electrostatic destruction preventing circuit for a receiving apparatus, provided with: a first Zener diode coupled to a receiving terminal of the receiving apparatus; a second Zener diode coupled to a ground terminal of the receiving apparatus, and connected to the first Zener diode in series and in reverse polarities to each other; a first resistor connected in parallel to the first Zener diode; and a second resistor connected in parallel to the second Zener diode.

According to the electrostatic destruction preventing circuit, in the event that a received signal voltage (positive polarity) which has an amplitude not higher than about twice of the forward direction voltage of each of the first and second Zener diodes is applied to the receiving terminal, one of the Zener diodes which is connected in the reverse voltage direction functions as a resistance component due to its leaking current. However, since it is connected to a resistor in parallel, most of the current flows through this resistor to the side of the Ground via the resistor which is connected in parallel to the other of Zener diodes which is connected in the forward voltage direction.

On the other hand, in the event that the received signal voltage (negative polarity) which has an amplitude not higher than about twice of the forward direction voltage of each of the first and second Zener diodes is applied to the receiving terminal, the other of the Zener diodes which is connected in the reverse voltage direction functions as the resistance component. However, since it is connected in parallel to the resistor, most of the current is flown through this resistor to the side of the antenna from the receiving terminal via the resistor which is connected in parallel to one of the other Zener diodes.

Therefore, the leaking current in the reverse voltage direction, which one of the Zener diodes has, does not become the forward direction current of the other of the Zener diodes, and is cancelled by the resistor. Thus, since the rectifying action is not operated, the condition generating the distortion in the signal wave form is disappeared, and the noise is not generated with respect to the received signal.

In one aspect of the electrostatic destruction preventing circuit of the present invention, the first resistor has a resistance higher than an input impedance of an antenna device connected to the receiving terminal and lower than an impedance prescribed by a first leaking current of the first Zener diode, the first leaking current flowing through the first Zener diode when a reverse voltage is applied thereto. The second resistor has a resistance higher than the input impedance of the antenna device and lower than an impedance prescribed by a second leaking current of the second Zener diode, the second leaking current flowing through the second Zener diode when a reverse voltage is applied thereto. According to this aspect of the present invention, since each of the resistors has a resistance higher than the antenna impedance, the voltage value is high enough by the amount of the input voltage due to these resistors, so that the input sensitivity is not degraded.

Further, since each of these resistances is lower than the equivalent resistance component due to the leaking current of each of the Zener diodes so as to by-pass the current of each of the Zener diodes, the rectifying action by one of the Zener diodes, which is in the forward direction voltage condition, is not operated. Thus, since the distortion in the wave form of the received signal is not generated, the noise is not generated.

In the electrostatic destruction preventing circuit of the present invention, the first and second Zener diodes may be arranged such that cathodes of the first and second Zener diodes are connected to each other. Alternatively, the first and second Zener diodes may be arranged such that anodes of the first and second Zener diodes are connected to each other.

The above object of the present invention can be also achieved by a receiving apparatus for receiving a signal from an antenna device, provided with: a receiving terminal coupled to the antenna device; a ground terminal connected to a ground; a first stage amplifier coupled to the receiving terminal for amplifying the signal received from the antenna device; and the above described electrostatic destruction preventing circuit of the present invention connected between the receiving terminal and the ground terminal for preventing an electrostatic destruction of the first stage amplifier by selectively passing an electric current from the receiving terminal therethrough to the ground.

According to the receiving apparatus of the present invention, the aforementioned advantageous effect of the present invention can be realized in the same manner since the receiving apparatus includes the aforementioned novel feature of the electrostatic destruction preventing circuit of the present invention.

The nature, utility, and further features of this invention will be more clearly apparent from the following detailed description with respect to preferred embodiments of the invention when read in conjunction with the accompanying drawings briefly described below.

BRIEF DESCRIPTION OF THE DRAWING

FIG. 2, which consist of FIG. 2A and FIG. 2B, are equivalent circuit diagrams of the electrostatic destruction preventing circuit of the first embodiment, wherein

FIG. 3 is a graph showing a disturbance characteristic of the VHF disturbance signal with respect to the medium wave receiving apparats;

DETAILED DESCRIPTION OF THE PREFERRED EMBODIMENTS

Referring to the accompanying drawings, preferred embodiments of the present invention will be explained. Particularly, in the present embodiments, an electrostatic destruction preventing circuit, which exhibits a Good property against the VHF signal inputted as a disturbance signal in an on-vehicle AM (Amplitude Modulation) receiving apparatus, is described.

Figure 1:
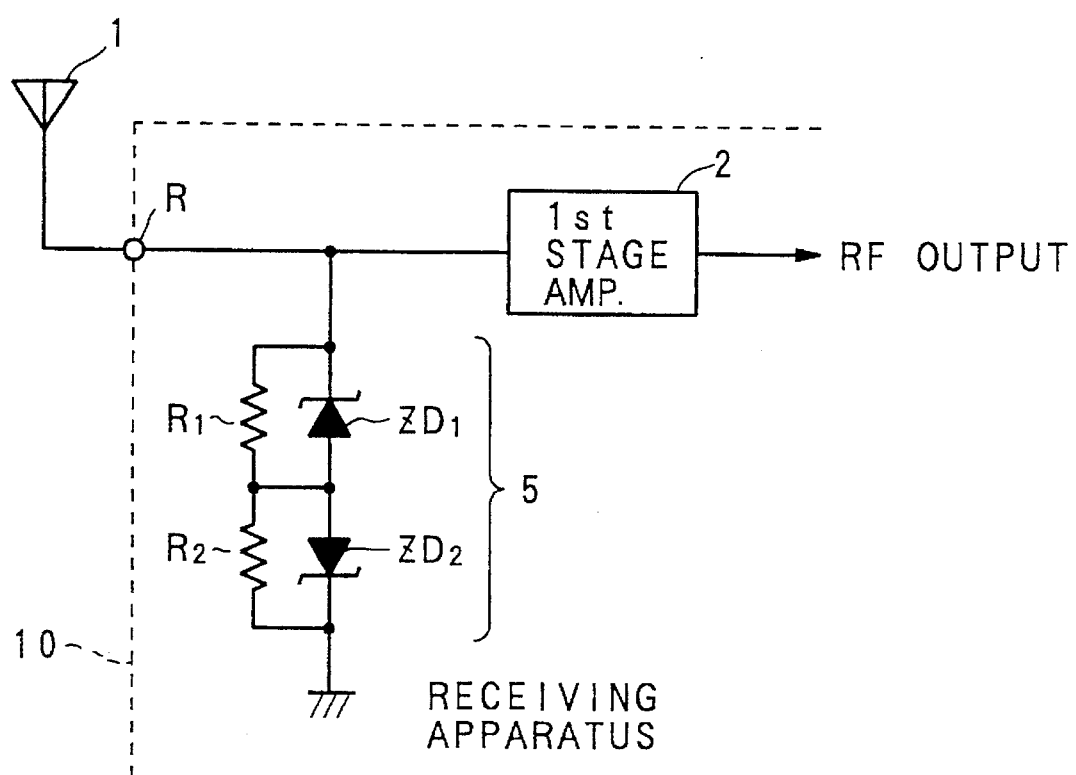
FIG. 1 is a circuit diagram showing a receiving apparatus having an electrostatic destruction preventing circuit as a first embodiment of the present invention.

FIG. 1 shows a construction of a first embodiment of the present invention.

As shown in FIG. 1, an electrostatic destruction preventing circuit 5 is provided between a receiving terminal R of a receiving apparatus 10 and a Ground in order to protect a first stage amplifier 2 from a surge voltage of high potential of a received signal inputted from an antenna 1. A first excess voltage preventing circuit to detect the surge voltage of high potential having a positive polarity is provided with a Zener diode $ZD_1$, which cathode terminal is connected to the receiving terminal R, and a resistor $R_1$, which is connected in parallel to the Zener diode $ZD_1$. A second excess voltage preventing circuit to detect the surge voltage of high potential having a negative polarity consists of a Zener diode $ZD_2$, which cathode terminal is grounded, and a resistor $R_2$, which is connected in parallel to the Zener diode $ZD_2$. Anode terminals of the Zener diodes $ZD_1$ and $ZD_2$ of the electrostatic destruction preventing circuit are connected to each other.

Nextly, the operation of the first embodiment is explained.

The first excess voltage preventing circuit and the second excess voltage preventing circuit respectively detect the voltage level of the received signal inputted from the antenna 1. Then, in case that the voltage level of the received signal is beyond a predetermined voltage range, they protect the first stage amplifier 2 from the electrostatic destruction by flowing the current to the ground.

When the received signal has the voltage value of positive polarity, the voltage, at which the protecting operation starts against the surge voltage of high potential on the high voltage side, is prescribed by the Zener voltage $V_{ZD1}$ of the Zener diode $ZD_1$ and the forward direction voltage Vf (about 0.6 [V]) of the Zener diode $ZD_2$. On the other hand, when the received signal has the voltage value of negative polarity, the voltage, at which the protecting operation starts on the low voltage side, is prescribed by the Zener voltage $V_{ZD2}$ of the Zener diode $ZD_2$ and the forward direction voltage Vf of the Zener diode $ZD_1$. By setting the Zener voltage Vf of each of the Zener diodes $ZD_1$ and $ZD_2$ to a range which does not exceed the input tolerable voltage of the first stage amplifier 2, an appropriate protecting operation is ascertained.

In the normal operation condition, the voltage of the received signal which is inputted thereto, is less than the sum of the Zener voltage of one of the Zener diodes and the forward direction voltage of the other of the Zener diodes. In this case, even under the condition that the voltage not higher than the Zener voltage is applied to the Zener diode, a certain amount of leaking current flows through the Zener diode although it is a small amount.

For example, supposing that the leaking current of each of the Zener diode $ZD_1$ and $ZD_2$ is 10 [μA], if the voltage value of the received signal has the positive polarity (24.6 [V]), the voltage applied to both ends of the Zener diode $ZD_1$ becomes 24 [V] (=24.6–0.6). Thus, this Zener diode $ZD_1$ is equivalent to having a resistance of 24 [V]/10 [μA]=2.4 [MΩ]. On the other hand, the resistance of the Zener diode $ZD_2$ connected in the forward voltage direction has a very large value when the forward direction voltage Vf is zero. At this time, the equivalent circuit of FIG. 1 is a circuit of FIG. 2A. Further, as the voltage increases, the resistance gradually approaches zero [Ω], so that it becomes in a condition equivalent to a condition that a diode component $ZD_2$ (broken line) is added in parallel to the resistor $R_2$ of the equivalent circuit of FIG. 2A.

Figure 2A:
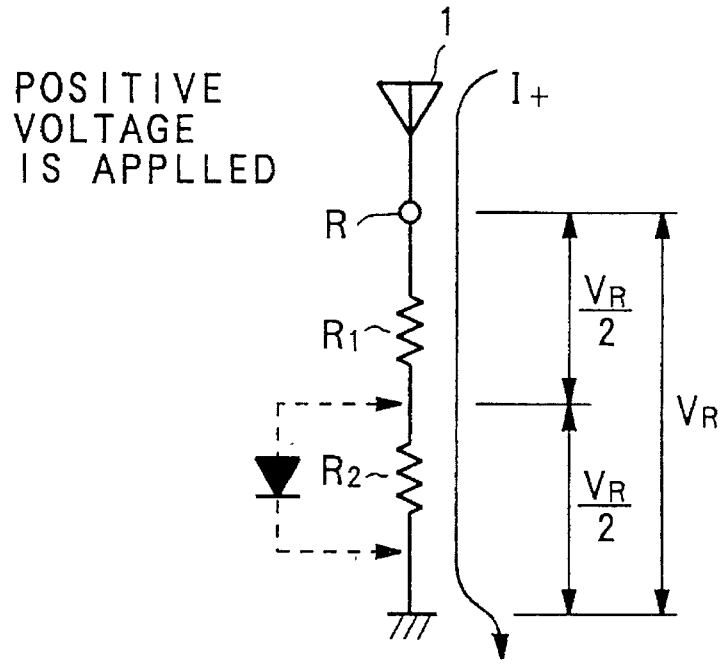
FIG. 2A is the case wherein the positive polarity voltage is applied to the circuit.

According to FIG. 2A, a current I+ flows from the antenna 1 to the ground (current indicated by a solid line). Here, if it is assumed that the voltage, which is not more than about twice of the forward direction voltage Vf of each of the Zener diodes $ZD_1$ and $ZD_2$ ($V_R<2$ Vf: positive polarity) is generated at the antenna 1, the resistance of the resistor $R_1$ is less than the resistance due to the leaking current of the Zener diode $ZD_1$ and the resistance of the resistor $R_2$ is less than the resistance due to the leaking current in the forward direction current of the Zener diode $ZD_2$. By this, the influence of the forward direction current of the Zener diode $ZD_2$ can be ignored. Further, the resistance of each of the resistors $R_1$ and $R_2$ at this time is set to be higher than the input impedance of the antenna 1. By this, the attenuation in the amplitude of the received signal at the receiving terminal R is little, and an enough signal voltage can be supplied to the first stage amplifier 2.

Figure 2B:
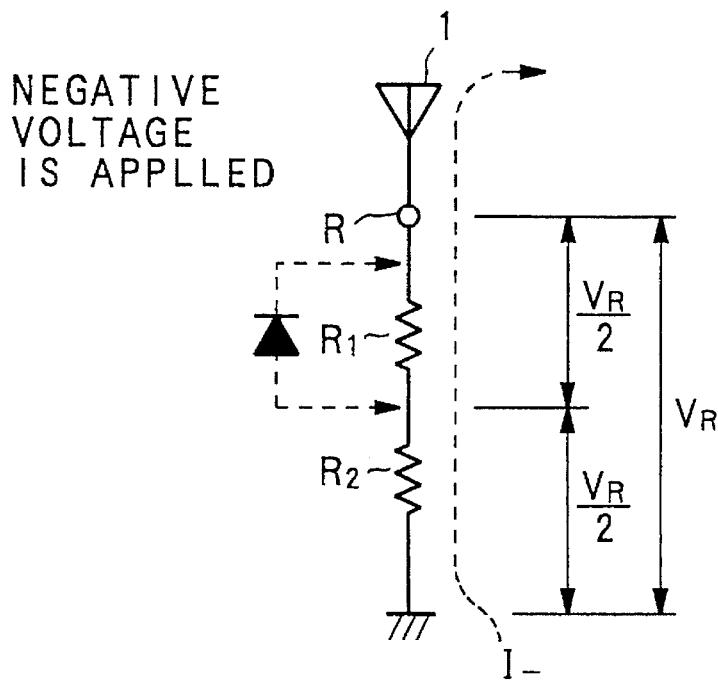
FIG. 2B is the case wherein the negative polarity voltage is applied to the circuit.

In the same manner, if such a case is assumed that the voltage, which is not more than about twice of the forward direction voltage Vf of each of the Zener diodes $ZD_1$ and $ZD_2$ ($V_R>-2$ Vf: negative polarity) is generated at the antenna 1, the equivalent circuit becomes as in FIG. 2B.

According to FIG. 2B, the current I– is flown from the side of the ground to the side of the antenna 1 through the resistor $R_1$ and the resistor $R_1$, which is connected in parallel to the Zener diode $ZD_1$ (current indicated by the broken line). Thus, the influence of the forward direction current of the Zener diode $ZD_1$ can be ignored. Further, the attenuation of the received signal at the receiving terminal R is little, and a sufficient signal can be supplied to the first stage amplifier 2.

Nextly, the resistances of the resistors $R_1$ and $R_2$ connected in parallel to the Zener diodes examined with referring a graph indicating an influence of the disturbance from other frequency band, which is easily generated in case that the circuit is used for the MW receiving apparatus.

Here, a comparison example of the electrostatic destruction preventing circuit, which has such a construction that the resistor $R_1$ and $R_2$ are removed from the construction of the present embodiment of FIG. 1, is considered and examined in detail.

Figure 4:
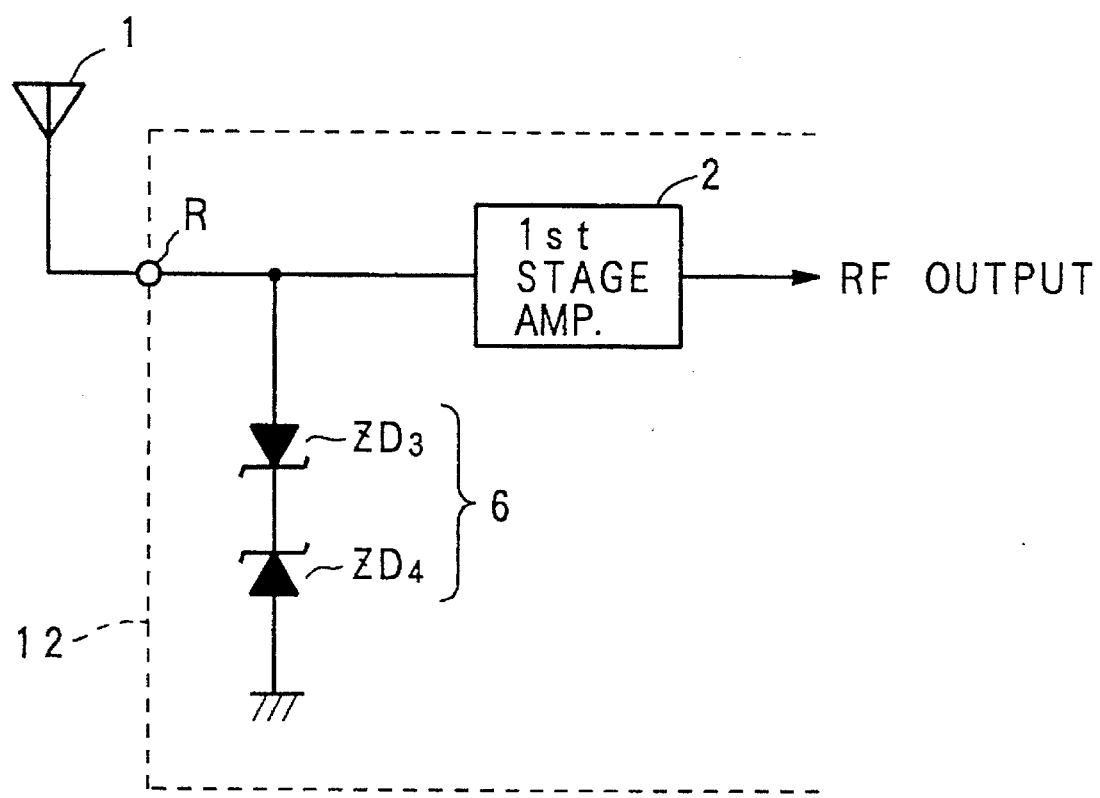
FIG. 4 is a circuit diagram showing an electrostatic destruction preventing circuit of a comparison example.

In FIG. 4, an electrostatic destruction preventing circuit 6 of the comparison example has Zener diodes $ZD_3$ and $ZD_4$, which are connected in reverse polarities to each other and which are connected between the input terminal R and the ground of a receiving apparatus 12, so as to protect the first stage amplifier 2 from an excess voltage inputted from the antenna 1. This electrostatic destruction preventing circuit 12 has such a characteristic that it is good in a response property at the time of surge absorption. However, this comparison example has such a problem that the disturbance from other frequency band is easily generated in case that the circuit is used for the MW receiving apparatus.

In FIG. 3, a characteristic curve 22 indicates the influence of this disturbance in the comparison example.

FIG. 3 shows an influence of the transmission interference Generated in the event that two signals in the VHF band (82 [MHz] and 82.8 [MHz]) are simultaneously applied to the antenna in the AM receiving apparatus (receiving frequency is 801 [kHz]) for receiving the electric wave in the MW band. An amplitude modulation of 400 [Hz], 30% is applied to either one of the VHF signals of 82 [MHz] and 82.8 [MHz]. Further, it is assumed that the output signal level, when the AM modulation signal of 801 [kHz], 74 [dBµ] is inputted, is 0 [dB] (as indicated by a line 28). With respect to this, the changes of the noise level of the receiving signal (801 [kHz]) with respect to the increase of the VHF signal intensity which is the applied disturbing signal are measured.

In FIG. 3, as indicated by a characteristic curve 20, in the case that the electrostatic destruction preventing circuit is not provided, the transmission-interfered input level dose not increase in its noise level until about 105 [dBµ]. However, as indicated by the characteristic curve 22 in FIG. 3, in the case that the electrostatic destruction preventing circuit 6 of the comparison example in FIG. 4 by means of the Zener diode $ZD_3$ and $ZD_4$ is provided, the noise level is distinguished in its increase from the vicinity of 80 [dBµ]. Namely, this indicates that the S/N ratio is degraded.

The cause of this transmission interference generated in the electrostatic destruction preventing circuit 6 of the comparison example is considered as followings.

Normally, the received electric wave in all of the frequency band ranges is inputted from the antenna 1. Ideally, the electric current (which is the electric current flowing through the Zener diodes $ZD_3$ and $ZD_4$ from the antenna 1 to the side of the ground in FIG. 4) does not flow through the inside of the Zener diodes constructing the electrostatic destruction preventing circuit 6, unless the voltage, which is not lower than the Zener voltage peculiar to the element, is applied thereto. Therefore, even if the input voltage level of the received signal becomes higher than the forward direction voltage Vf of the Zener diode, a distortion in the signal wave form is not supposed to be generated.

However, in the Zener diode, there generally exists a leaking voltage even at a voltage which is not higher than the Zener voltage. Thus, in the normal receiving condition where no abnormal voltage is applied, the Zener diode provided in the reverse voltage direction (the cathode terminal is on the high voltage side) functions as a kind of resistance component. On the other hand, the resistance of the Zener diode with respect to the forward direction voltage (the anode terminal is on the high voltage side) exhibits a non-linear property which decreases gradually as the forward direction voltage increases. By this, in the circuit of the comparison example shown in FIG. 4, an equivalent resistor due to the leaking current in the reverse voltage direction is equivalent to the existence of the diode, which is connected in the forward direction.

As the voltage of the received signal increases from zero to approach the forward direction voltage Vf of the Zener diode, a weak limiter action is operated with respect to the received signal, so that a distortion in the signal wave form is Generated in this comparison example of FIG. 4.

Further, in case that there exist a plurality of received signals in other frequency band ranges, as the input level of this received signal is increased, a distortion in the wave form of each received signal is Generated. Further, it is estimated that there is Generated other frequency component in the added and subtracted frequency of the frequencies of the plurality of received signals. Particularly, with respect to a receiving apparatus for receiving an electric wave of a modulation method which is poor against the disturbance such as the AM method, the influence of the noise Generated by the distortion of this wave form is concluded to be significantly large.

Therefore, in order to solve the above problem of the comparison example of FIG. 4, the leaking current of the Zener diode in the normal usage condition may be restrained as much as possible, or the forward direction current of the Zener diode connected in its forward direction may be reduced.

From this viewpoint, the present embodiment of FIG. 1 is provided with the resistors $R_1$ and $R_2$. The advantageous effect of the present embodiment over the comparison example of FIG. 4 is now explained with referring to FIG. 3.

In FIG. 3, characteristic curves 24 and 26 indicate the influence of the disturbance due to the VHF signal of the electrostatic destruction preventing circuit 5 of the present embodiment. The reference numeral 24 corresponds to the case where each of the resistors $R_1$ and $R_2$ has 470 [kΩ], and the reference numeral 26 corresponds to the case where each has 100 [kΩ].

As understood from FIG. 3, as the resistance is decreased (the curve 22 -> the curve 24 -> the curve 26) from the condition where there is no resistor at all (the disturbance property of the curve 22), it approaches the property of an ideal condition (the curve 20) where there is no harmful influence of the electrostatic destruction preventing circuit.

However, by decreasing the resistance, while the improvement in the characteristic can be promoted, there is a tendency that the sensitivity of the receiving apparatus itself is degraded in case of the low resistance. In the measurement, although the degradation of the sensitivity is hardly observed in the case of 470 [kΩ] as indicated by the characteristic curve 24, the degradation of the practical sensitivity by about 0.5 [dB] is observed in the case of 100 [kΩ] as indicated by the characteristic curve 22.

The cause of this is estimated that the signal level of the received signal is decreased due to the voltage-division of the resistance component of the antenna impedance and the resistors of the electrostatic destruction preventing circuit. Thus, it is necessary to select the minimum value of each of the resistors to be such a large value that the antenna impedance of the receiving apparatus can be ignored. Such a value is set not to influence the practical sensitivity, and preferably, it is set to be resistance value of not less than 10 times to 50 times of the antenna impedance.

In the present embodiment, the capacity of the antenna of the on-vehicle AM receiving apparatus is about 15 [pF]. The impedance at the frequency (e.g. 1000 [kHz]) of the medium wave band at this capacity is abut 10 [kΩ]. Thus, it is understood that the preferable resistance for the resistors $R_1$ and $R_2$ in the present embodiment is necessary to be not less than about 100 [kΩ].

Further, as the limitation with respect to the maximum value of the resistance, such a value is set that can reduce the influence of the equivalent resistance value due to the leaking current of the Zener diode. For example, in case that the Zener diode is for 24 [V] and the leaking current thereof is 10 [μA], the equivalent resistance is 2.4 [MΩ]. It is necessary that the resistance of each of the resistors $R_1$ and $R_2$ is smaller than this value of the equivalent resistor.

As described above, according to the present embodiment, by setting the resistance of each of the resistors $R_1$ and $R_2$ to be more than 100 [kΩ], an electrostatic destruction preventing circuit can be provided which hardly gives an influence to the receiving sensitivity and which noise level due to the VHF signal is also low.

Figure 5:
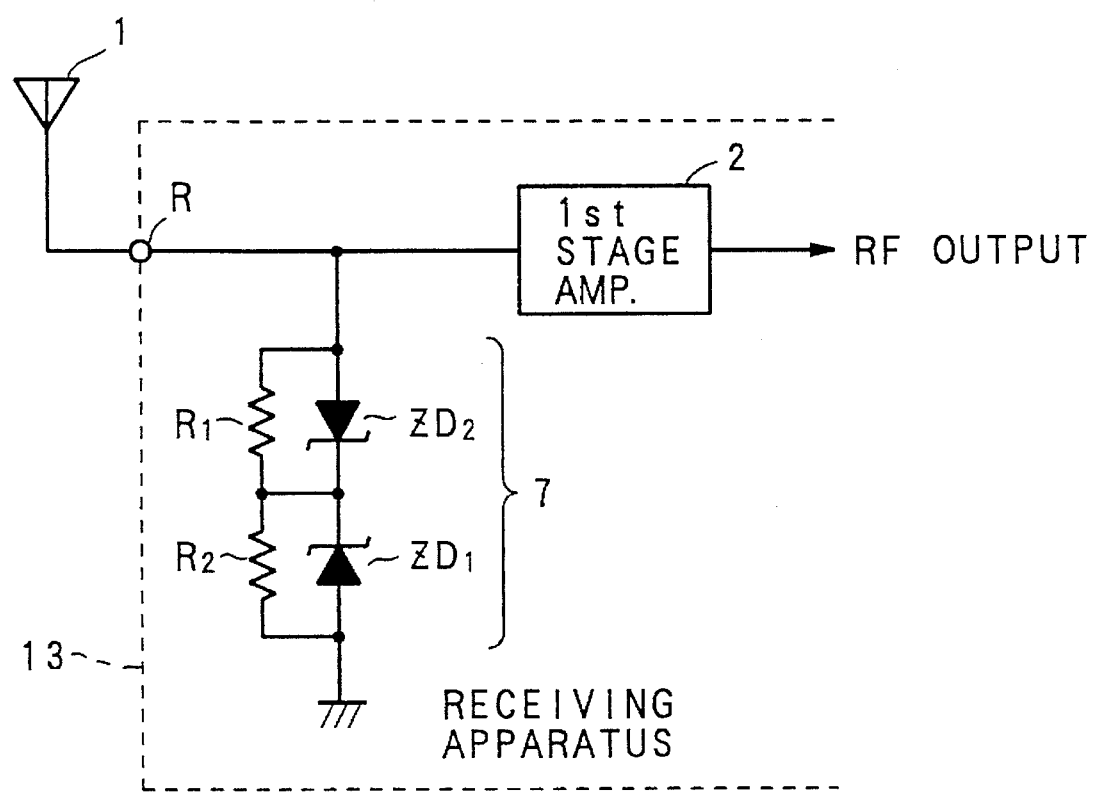
FIG. 5 is a circuit diagram showing a receiving apparatus having an electrostatic destruction preventing circuit of a second embodiment of the present invention.

FIG. 5 shows a second embodiment of the present invention. The same constitutional elements as those in the first embodiment of FIG. 1 carry the same reference numerals and the explanations thereof are omitted.

In FIG. 5, an electrostatic destruction preventing circuit 7 in a receiving apparatus 13 has such a construction that the order of the Zener diodes $ZD_1$ and $ZD_2$ are reversed with respect to the first embodiment of FIG. 1. Namely, the Zener diode $ZD_1$ to prevent the excess voltage of the positive polarity is provided at the Ground side and the Zener diode $ZD_2$ to prevent the excess voltage of the negative polarity is provided at the receiving terminal side. In this case, the characteristic is the same, while the upper and lower relationship of the Zener diodes and the resistance components of the equivalent circuit are only reversed with respect to the first embodiment.

Various modifications are possible while the present invention is not limited to the above embodiments.

For example, although the Zener diode is applied as the element to detect the excess voltage in the present embodiments, a switch by means of a transistor may perform this function instead.

Further, the AM receiving apparatus for the middle band is assumed in the present embodiments, it may be applied to a receiving apparatus of short wave etc. in which a transmission interference may occur due to a high frequency signal such as a VHF signal.

As described above, according to the present embodiments, since the rectifying action of the Zener diode is cancelled by the resistor provided in parallel to the Zener diode, the distortion in the wave form of the received signal is not generated. By this, it is possible to increase the tolerance with respect to the disturbance signal in the other frequency band range which starts the transmission interference.

Further, according to the present embodiments, since the resistance of each resistor which is connected to the Zener diode in parallel is set to be such a high value that the influence of the antenna impedance can be ignored, it is possible to provide the electrostatic destruction preventing circuit which is superior in the anti-disturbance signal characteristic and which does not degrade the receiving sensitivity.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An electrostatic destruction preventing circuit for a receiving apparatus, comprising:

a first Zener diode coupled to a receiving terminal of the receiving apparatus;

a second Zener diode coupled to a ground terminal of the receiving apparatus, and connected to said first Zener diode in series and in reverse polarities to each other;

a first resistor connected in parallel to said first Zener diode; and a second resistor connected in parallel to said second Zener diode.

2. An electrostatic destruction preventing circuit according to claim 1, wherein:

said first resistor has a resistance higher than an input impedance of an antenna means connected to the receiving terminal and lower than an impedance prescribed by a first leaking current of said first Zener diode, said first leaking current flowing through said first Zener diode when a reverse voltage is applied thereto; and said second resistor has a resistance higher than the input impedance of the antenna means and lower than an impedance prescribed by a second leaking current of said second Zener diode, said second leaking current flowing through said second Zener diode when a reverse voltage is applied thereto.

3. An electrostatic destruction preventing circuit according to claim 1, wherein said first and second Zener diodes are arranged such that cathodes of said first and second Zener diodes are connected to each other.

4. An electrostatic destruction preventing circuit according to claim 1, wherein said first and second Zener diodes are arranged such that anodes of said first and second Zener diodes are connected to each other.

5. A receiving apparatus for receiving a signal from an antenna means, comprising:

a receiving terminal coupled to the antenna means;

a ground terminal connected to a ground;

a first stage amplifier coupled to the receiving terminal for amplifying the signal received from the antenna means; and an electrostatic destruction preventing circuit connected between said receiving terminal and said ground terminal for preventing an electrostatic destruction of said first stage amplifier by selectively passing an electric current from said receiving terminal therethrough to said ground, said electrostatic destruction preventing circuit comprising:

a first Zener diode coupled to said receiving terminal;

a second Zener diode coupled to said ground terminal, and connected to said first Zener diode in series and in reverse polarities to each other;

a first resistor connected in parallel to said first Zener diode; and a second resistor connected in parallel to said second Zener diode.

6. A receiving apparatus according to claim 5, wherein:

said first resistor has a resistance higher than an input impedance of the antenna means and lower than an impedance prescribed by a first leaking current of said first Zener diode, said first leaking current flowing through said first Zener diode when a reverse voltage is applied thereto; and said second resistor has a resistance higher than the input impedance of the antenna means and lower than an impedance prescribed by a second leaking current of said second Zener diode, said second leaking current flowing through said second Zener diode when a reverse voltage is applied thereto.

* * * * *